(12) United States Patent
Baker

(10) Patent No.: US 11,776,872 B2
(45) Date of Patent: Oct. 3, 2023

(54) ACCORDION HEAT SINK

(71) Applicant: ARRIS Enterprises LLC, Suwanee, GA (US)

(72) Inventor: Ryan Baker, Alpharetta, GA (US)

(73) Assignee: ARRIS ENTERPRISES LLC, Suwanee, GA (US)

( * ) Notice: Subject to any disclaimer, the term of this patent is extended or adjusted under 35 U.S.C. 154(b) by 0 days.

(21) Appl. No.: 17/174,565

(22) Filed: Feb. 12, 2021

(65) Prior Publication Data

US 2021/0280494 A1    Sep. 9, 2021

Related U.S. Application Data

(60) Provisional application No. 62/986,067, filed on Mar. 6, 2020.

(51) Int. Cl.
*H01L 23/40* (2006.01)
*H05K 7/20* (2006.01)

(52) U.S. Cl.
CPC ......... *H01L 23/40* (2013.01); *H05K 7/20509* (2013.01)

(58) Field of Classification Search
CPC ............... H05K 7/2039; H05K 7/2049; H05K 7/20154; H05K 7/20509; H05K 1/0201–0203; H01L 23/367; H01L 23/40–4006; H01L 23/4093; H01L 23/4081; H01L 23/4037; H01L 23/405; H01L 23/4075–4087; G06F 1/20; G06F 1/203; G01R 1/0458
See application file for complete search history.

(56) References Cited

U.S. PATENT DOCUMENTS

| | | | | |
|---|---|---|---|---|
| 6,244,332 B1 * | 6/2001 | Gesklin | ............... | H01L 23/3672 165/80.3 |
| 6,587,345 B2 * | 7/2003 | Chu | ........................ | H01L 23/04 29/890.03 |
| 6,659,168 B1 * | 12/2003 | Barsun | ................ | H01L 23/3672 165/80.3 |
| 7,344,345 B2 * | 3/2008 | Aukzemas | ............ | F16B 5/0241 411/183 |
| 10,170,868 B1 * | 1/2019 | Oyake | ................... | H01R 13/652 |
| 2002/0084060 A1 * | 7/2002 | Sasaki | ................. | H01L 23/3672 165/80.3 |
| 2002/0131238 A1 * | 9/2002 | Fisher | ..................... | H01L 23/40 361/719 |
| 2005/0180116 A1 * | 8/2005 | Yamanaka | ........... | H05K 1/0203 361/718 |

(Continued)

FOREIGN PATENT DOCUMENTS

WO    WO-2016030156 A1 *  3/2016  .............. F21S 43/14
WO    WO-2019159014 A1 *  8/2019  ......... H05K 7/20445

*Primary Examiner* — Amir A Jalali
(74) *Attorney, Agent, or Firm* — Wenderoth, Lind & Ponack, L.L.P.

(57) ABSTRACT

A heat sink includes a first flange, a second flange, and an accordion-shaped medial portion continuous between the first flange and the second flange. The first flange and the second flange are configured to be attached to a circuit board. The accordion-shaped medial portion includes troughs on a proximal side of the accordion-shaped medial portion and crests on a distal side of the accordion-shaped medial portion such that the heat sink is configured to disperse heat away from the circuit board.

15 Claims, 4 Drawing Sheets

(56) References Cited

U.S. PATENT DOCUMENTS

| | | | | |
|---|---|---|---|---|
| 2014/0016998 A1* | 1/2014 | Monson | ............... | F16B 2/12 |
| | | | | 403/327 |
| 2015/0373870 A1* | 12/2015 | Lee | ............... | H05K 7/20918 |
| | | | | 361/709 |
| 2016/0100511 A1* | 4/2016 | Kurz | ............... | H01L 21/4882 |
| | | | | 174/377 |
| 2017/0219182 A1* | 8/2017 | Duarte | ............... | F21S 43/14 |
| 2019/0051611 A1* | 2/2019 | Kim | ............... | H01L 23/3121 |
| 2020/0137931 A1* | 4/2020 | Lee | ............... | H05K 9/0022 |

\* cited by examiner

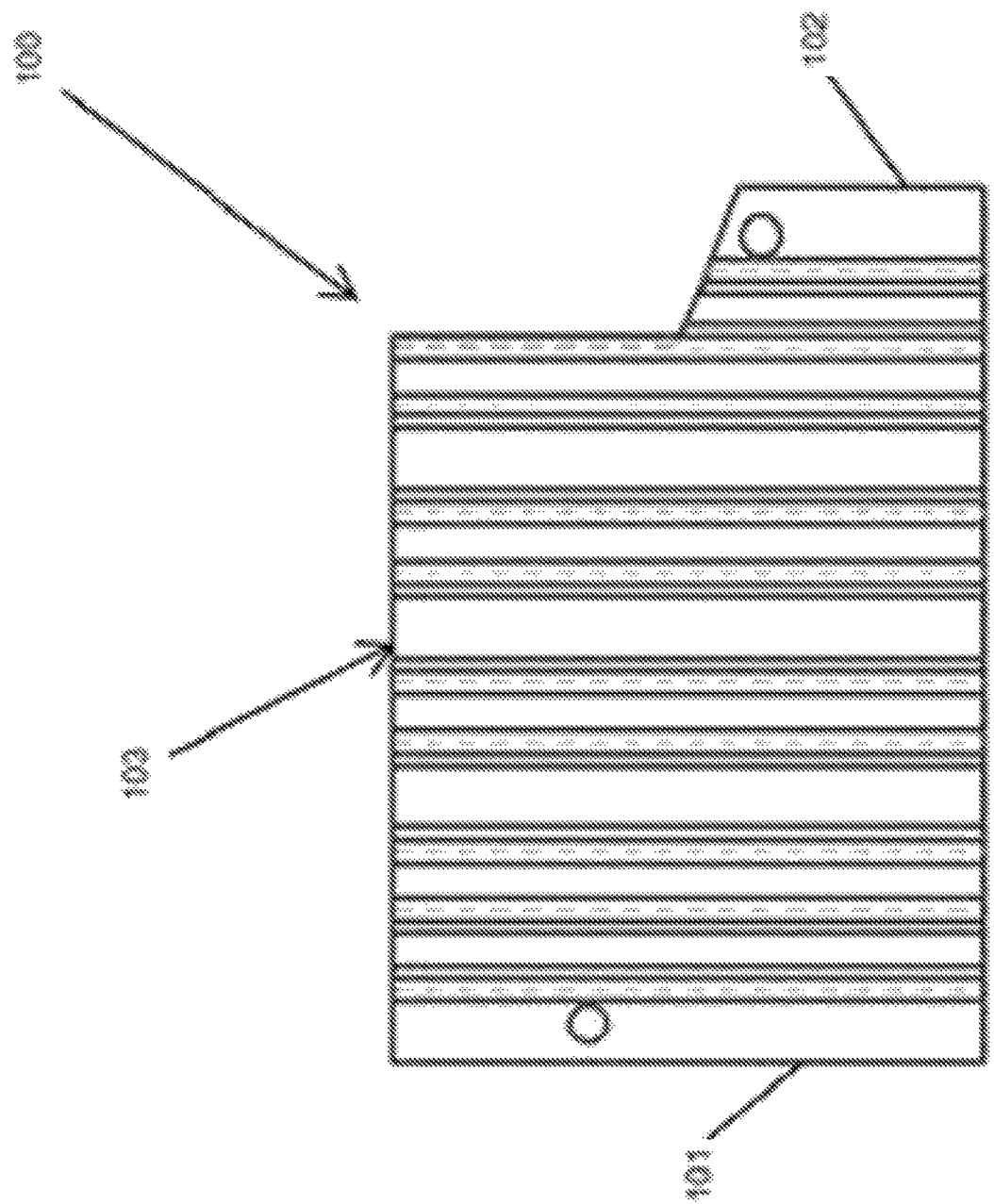

ACCORDION HEAT SINK

BACKGROUND

Popular electronic apparatuses in many homes include the modem, the router, the so-called "set-top-box" (STB), smart speakers, and Smart Media Devices (SMD) which may include voice and gesture user interfaces utilizing cameras, speakers, and far field microphones. These apparatuses house electronic circuits that convert signals from an input line into signals usable by end devices for displaying or playing data such as audio/video media content including television programing and movies. The router houses electronic circuits that forward signals between networks.

The electronic circuits may include circuit boards or panels on which interconnected circuits and other components are mounted or printed. Since components such as front end modules (FEMs) produce a substantial amount of heat, thermal management techniques are implemented for dissipation of the heat so as to protect the components from a degradation in operating performance or damage.

Existing solutions involve mounting a heat sink with a flat base plate and vertical fins on top of a circuit board, thereby allowing heat to travel both horizontally across the flat base plate and upward along the vertical fins so as to be dispersed into cooler air.

However, the flat base plate of existing solutions is in close proximity to the circuit board, covers components of the circuit board and traps heat underneath whereby the heat is dispersed over the circuit board from higher-temperature components such as FEMs to lower-temperature components such as power management integrated circuits (PMICs). Furthermore, the fins of existing solutions have limited surface areas which limit the amount of heat that can be dissipated. In addition, existing solutions are typically die cast or extruded designs entailing expensive manufacturing techniques. Therefore, existing solutions fail to optimally dissipate heat and are not cost-effective.

Thus, it would be advantageous and an improvement over existing solutions to provide a heat sink that disperses heat away from both higher-temperature components and lower-temperature components of a circuit board and is less expensive to produce.

SUMMARY

A heat sink for use with an apparatus (such as in a modem) is disclosed in the present application.

The heat sink comprises:
a first flange;
a second flange; and
an accordion-shaped medial portion continuous between the first flange and the second flange,
wherein:
the first flange and the second flange are configured to be attached to a circuit board; and
the accordion-shaped medial portion includes troughs on a proximal side of the accordion-shaped medial portion and crests on a distal side of the accordion-shaped medial portion such that the heat sink is configured to disperse heat away from the circuit board.

BRIEF DESCRIPTION OF THE DRAWINGS

FIG. 4 is a bottom view of the exemplary heat sink 100.

DETAILED DESCRIPTION

Exemplary embodiments will be described in detail below with reference to the drawings. The description and drawings are provided so that a person skilled in the art can fully understand the present disclosure and are not intended to limit the subject matter recited in the claims.

The heat sink and apparatus disclosed herein provide an accordion-shaped medial portion and can disperse heat away from both higher-temperature components and lower-temperature components of a circuit board.

The heat sink and apparatus disclosed herein address and solve the following problems:

How to provide maximum surface area for dissipating heat.

How to avoid trapping of heat underneath a heat sink.

How to prevent overheating of higher-temperature components of a circuit board.

How to prevent heat transfer to lower-temperature components of a circuit board underneath a heat sink.

How to reduce the cost of a heat sink.

How to leverage the solution to the above-mentioned problems in a heat sink with a minimal number of parts.

The heat sink and apparatus disclosed herein solve the problems identified above and provide an efficient and cost effective solution to dispersing heat away from both higher-temperature components and lower-temperature components of a circuit board.

The heat sink disclosed herein transfers heat into colder air and releases the heat away from the circuit board. The heat sink disclosed herein can reduce the temperature of FEMs on a circuit board by 20 degrees compared to existing solutions with flat base plates.

Figure 1:
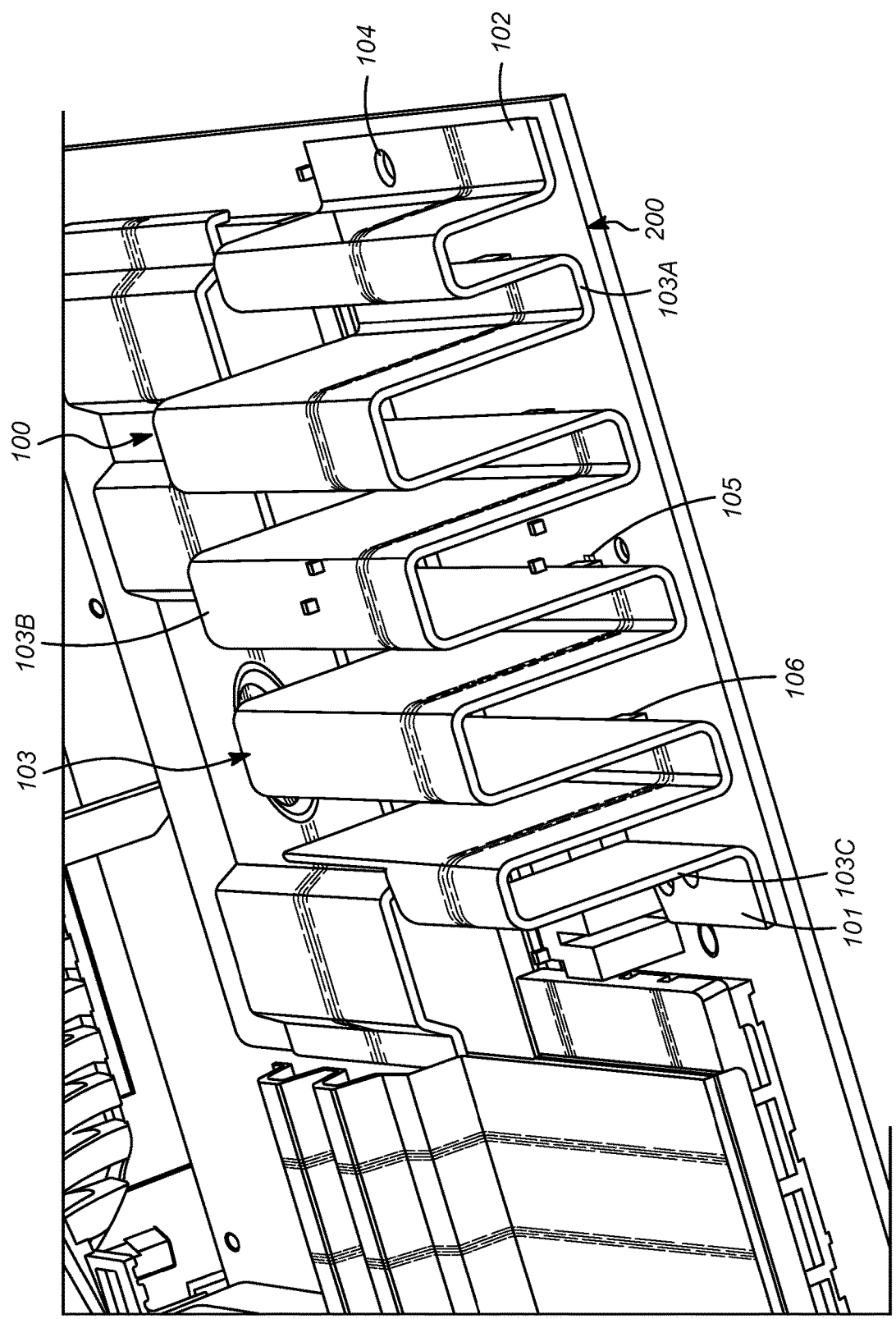
FIG. 1 is a top perspective view of an example apparatus including an exemplary heat sink 100 and a circuit board 200.

FIG. 1 is a perspective view of an example apparatus including an exemplary heat sink 100 and a circuit board 200. The apparatus may be part of any electronic device, such as a modem, a router, an STB, SMD, or other stand-alone device, or may be incorporated in a television or other content playing apparatus, or other device or appliance and the scope of the present invention is not intended to be limited to such forms.

The heat sink 100 may include a first flange 101, a second flange 102, an accordion-shaped medial portion 103 including troughs 103A and crests 103B. The troughs 103A and the crests 103B may alternate over a length of the accordion-shaped medial portion 103 (for example, in the X-axis direction of the heat sink 100). A first end of the accordion-shaped medial portion 103 may adjoin the first flange 101 and a second end of accordion-shaped medial portion 103 may adjoin the second flange 102 such that the accordion-shaped medial portion 103 is continuous between the first flange 101 and the second flange 102. The troughs 103A may be on a proximal side of the accordion-shaped medial portion 103, adjacent to the circuit board 200. The crests 103B may be on a distal side of the accordion-shaped medial portion 103, opposite to the circuit board 200. In some embodiments, the accordion-shaped medial portion 103 may further include planar sections 103C between the troughs 103A and the crests 103B. The troughs 103A and/or the crests 103B may be arcuate. For example, the troughs 103A may have a U-shape and the crests 103B may have an inverted U-shape.

One or both of the flanges 101, 102 may include a hole into which a spring pin 104 is fitted so as to attach the flange 101 or 102 to the circuit board 200. Any number of spring pins 104 can be provided. A thermal pad 105 may be provided between any of the troughs 103A and the circuit board 200.

The circuit board 200 can be any type of circuit board such as a printed circuit board, for example. The circuit board 200 may include components such as FEMs 106 or PMICs. Such components may be arranged in a row on the circuit board 200. In the embodiment shown, the heat sink 100 is configured such that the troughs 103A are aligned with the highest-temperature components that are present on the circuit board 200. For example, an FEM 106 may be positioned underneath a trough 103A. The thermal pad 105 may be between the FEM 106 and the trough 103A.

The troughs 103A are arranged so as to make contact with components on the circuit board 200, or to be in a close proximity thereto which allows heat exchange from the component to the respective trough 103A of the heat sink 100. Connection between the heat sink 100 and components of the circuit board 200 can be made, for example, by pressing the thermal pad 105 between the component and the trough 103A to facilitate the transfer of heat into the heat sink 100. With the spring pin(s) 104, the heat sink 100 is both secured and has sufficient contact force with the components of the circuit board 200 and thermal pad(s) 105. Alternatively or in addition, any other thermally conductive arrangement known in the art can be provided. The heat sink 100 can be formed and shaped in the appropriate manner depending on the application, i.e., the locations, shapes, and sizes of the components on the circuit board and their temperature values.

Figure 2:
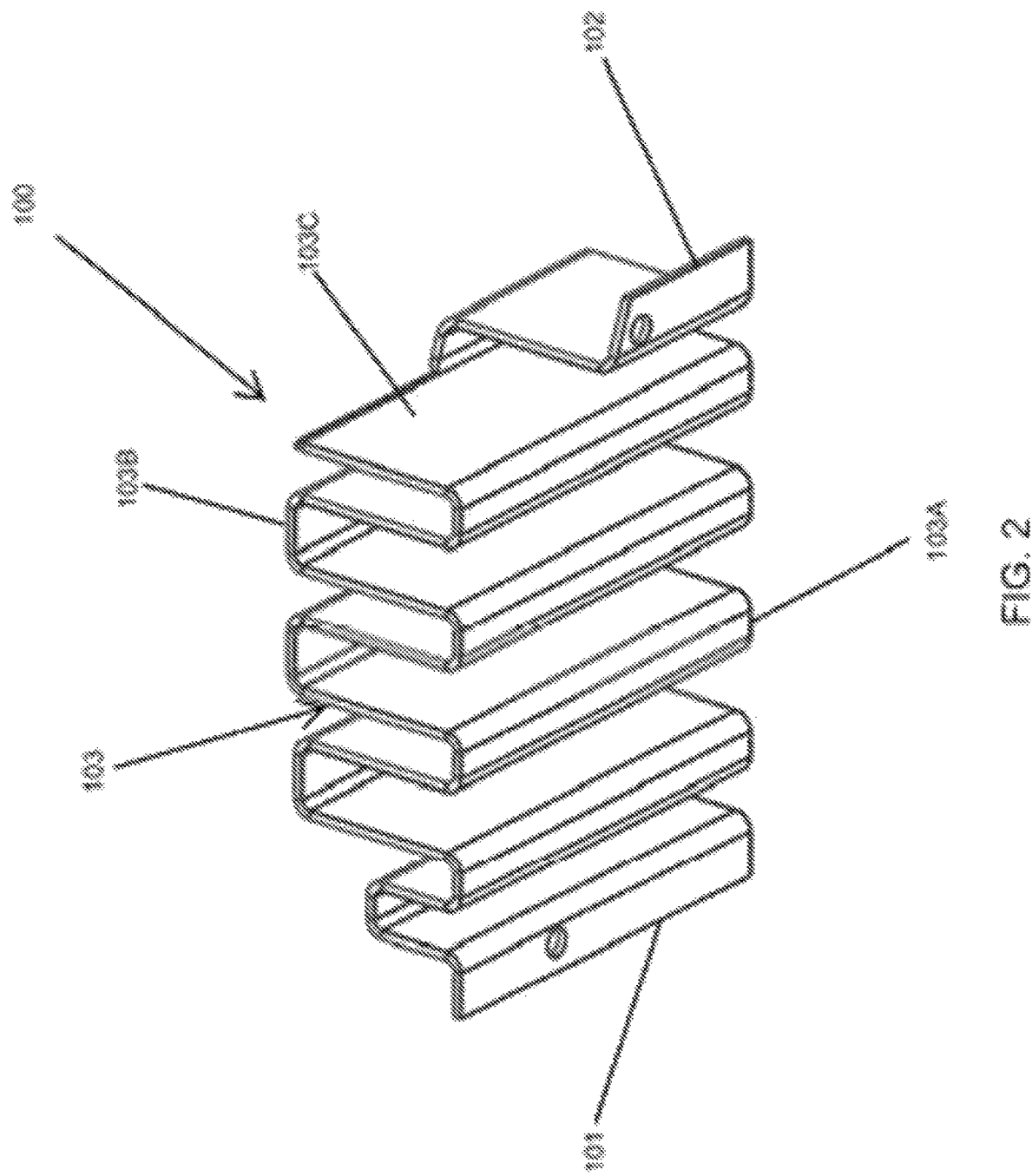
FIG. 2 is a bottom perspective view of the exemplary heat sink 100.

FIG. 2 is a bottom perspective view of the exemplary heat sink 100. Depending on the application, the shapes, sizes and locations of the components of the heat sink may differ. As shown in FIG. 2, some of the planar sections 103C may have a different height (for example, in a Y-axis direction of the heat sink 100) than the other planar sections 103C. One or more of the troughs 103A may have a different width (for example, in an X-axis direction of the heat sink 100) than the other troughs 103A. Similarly, one or more of the crests 103B may have a different width (for example, in the X-axis direction of the heat sink 100) than the other crests 103B. One or more of the crests 103B may have a different length (for example, in a Z-axis direction of the heat sink 100) than the other crests 103B. Due to the different heights, widths and/or lengths, the heat sink 100 may be shaped so as to accommodate components of various sizes on the circuit board 200.

Figure 3:
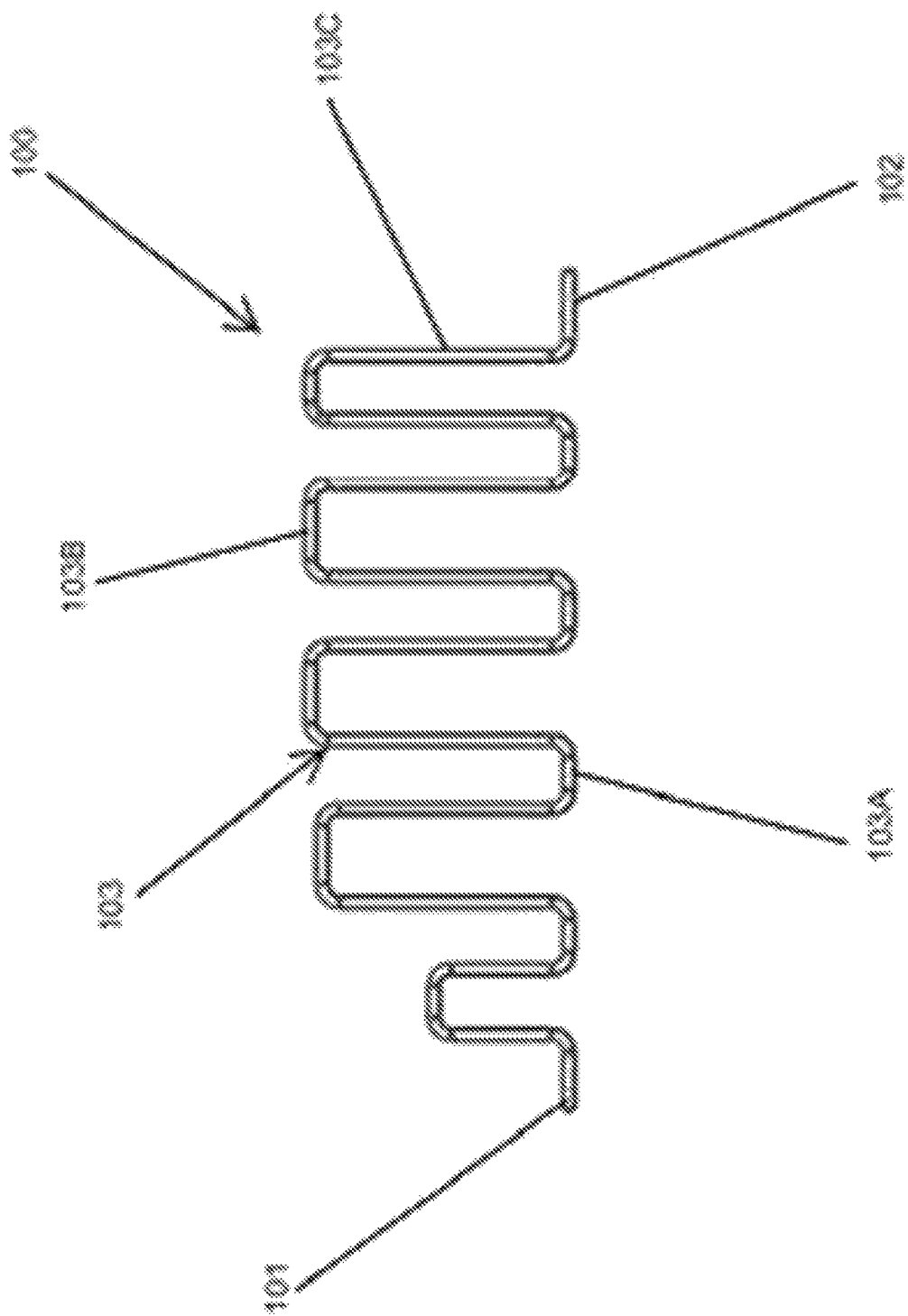
FIG. 3 is a side view of the exemplary heat sink 100.

FIG. 3 is a side view of the exemplary heat sink 100. As shown in FIG. 3, either or both of the flanges 101, 102 may be planar.

FIG. 4 is a bottom view of the exemplary heat sink 100. As shown in FIG. 4, a length of the first flange 101 (for example, in the Z-axis direction of the heat sink 100) may be different from a length of the second flange 102 (for example, in the Z-axis direction of the heat sink 100).

In the embodiment shown, the accordion-shaped medial portion 103 has four troughs 103A and four crests 103B. However, any number of troughs 103A and any number of crests 103B can be provided.

The heat sink 100 may be of single piece construction. The heat sink 100 may be comprised of plastic and/or sheet metal. Alternatively or in addition, any other construction material known in the art can be used. In some embodiments, the heat sink 100 may be a single piece of sheet metal that is pressed so as to form the accordion-shaped medial portion 103.

Since the heat sink 100 has the accordion-shaped medial portion 103, heat is immediately dispersed up and away from the circuit board 200. Lower-temperature components that are under the heat sink 100 around power-consuming higher-temperature components are uncovered or exposed (e.g., between the troughs 103A and under the crests 103B of the heat sink 100) and heat is not trapped over such lower-temperature components. In other words, the circuit board 200 may be exposed underneath the crests 103B. As a result, heat from the higher-temperature components connected to the heat sink 100 is not dispersed to the lower-temperature components that are also under the heat sink 100.

Once the heat sink 100 has collected the heat from the components, the heat is transferred up into cooler air by the arcuate crests 103B. By having curves instead of traditional straight-line fins, more surface area is present in the cooler air. The larger amount of surface area present in the cooler air results in more heat being dissipated which in turn draws more heat out of the higher-temperature components.

The heat sink 100 can be implemented on any set of higher-temperature components that are spaced apart on a circuit board. The distance between troughs 103A can be adjusted so as to ensure that the troughs 103A make contact with the higher-temperature components.

It is also contemplated that the implementation of the components of the present invention can be done with any newly arising technology that may replace any of the above implementation technologies.

In view of the above, the heat sink and apparatus disclosed herein solve the problems of existing solutions and the combination of the manufacturing style, precise trough connection with higher-temperature components, lack of a traditional flat base plate, and crests configured to be spaced apart from the circuit board provide an efficient and cost effective solution to disperse heat away from both higher-temperature components and lower-temperature components of a circuit board.

We claim:

1. A heat sink comprising:
    a first flange;
    a second flange;
    an accordion-shaped medial portion continuous between the first flange and the second flange; and
    a spring pin,
    wherein:
    the first flange and the second flange are configured to be attached directly onto a top surface of a circuit board;
    the accordion-shaped medial portion includes troughs on a proximal side of the accordion-shaped medial portion and crests on a distal side of the accordion-shaped medial portion such that the heat sink is configured to disperse heat away from the circuit board;
    the accordion-shaped medial portion includes planar sections between the troughs and the crests;
    at least one of the planar sections has a height which is different than a height of each of a remainder of the planar sections such that the heat sink is shaped for accommodating components of various sizes on the circuit board; and
    the spring pin is configured to attach the first flange or the second flange directly to the circuit board.

2. The heat sink of claim 1, wherein the first flange or the second flange is planar.

3. The heat sink of claim 1, further comprising a thermal pad underneath one of the troughs.

4. The heat sink of claim 1, wherein a width of the first flange is different from a width of the second flange.

5. The heat sink of claim 1, wherein the troughs and the crests are arcuate.

6. The heat sink of claim 1, wherein the heat sink is formed of sheet metal.

7. The heat sink of claim 1, wherein the heat sink is of single piece construction.

8. The heat sink of claim 1, wherein the planar sections are configured to be orthogonal to the circuit board.

9. An apparatus comprising:
a circuit board; and
a heat sink;
wherein:
the heat sink comprises a first flange, a second flange, an accordion-shaped medial portion continuous between the first flange and the second flange, and a spring pin;
the first flange and the second flange are attached directly onto a top surface of the circuit board;
the accordion-shaped medial portion includes troughs on a proximal side of the accordion-shaped medial portion and crests on a distal side of the accordion-shaped medial portion such that the heat sink is configured to disperse heat away from the circuit board;
the accordion-shaped medial portion includes planar sections between the troughs and the crests;
at least one of the planar sections has a height which is different than a height of each of a remainder of the planar sections such that the heat sink accommodates components of various sizes on the circuit board; and
the first flange or the second flange is attached directly to the circuit board by the spring pin.

10. The apparatus of claim 9, further comprising a thermal pad between one of the troughs and the circuit board.

11. The apparatus of claim 9, wherein the troughs and the crests are arcuate.

12. The apparatus of claim 9, wherein the heat sink is formed of sheet metal.

13. The apparatus of claim 9, wherein the heat sink is of single piece construction.

14. The apparatus of claim 9, wherein the planar sections are orthogonal to the circuit board.

15. An apparatus comprising:
a circuit board; and
a heat sink;
wherein:
the heat sink comprises a first flange, a second flange, an accordion-shaped medial portion continuous between the first flange and the second flange, and a spring pin;
the first flange and the second flange are attached directly onto a top surface of the circuit board; and
the accordion-shaped medial portion includes troughs on a proximal side of the accordion-shaped medial portion and crests on a distal side of the accordion-shaped medial portion such that the heat sink is configured to disperse heat away from the circuit board;
the troughs make contact with higher-temperature components of the circuit board;
the crests leave lower-temperature components of the circuit board uncovered or exposed; and
the first flange or the second flange is attached directly to the circuit board by the spring pin.

* * * * *